United States Patent
Kim et al.

(10) Patent No.: US 7,999,591 B2
(45) Date of Patent: Aug. 16, 2011

(54) DESKEW SYSTEM FOR ELIMINATING SKEW BETWEEN DATA SIGNALS AND CLOCK AND CIRCUITS FOR THE DESKEW SYSTEM

(75) Inventors: Tae-Jin Kim, Seoul (KR); Jang Jin Nam, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

(21) Appl. No.: 12/318,306

(22) Filed: Dec. 24, 2008

(65) Prior Publication Data
US 2009/0184743 A1 Jul. 23, 2009

(30) Foreign Application Priority Data
Dec. 28, 2007 (KR) .................. 10-2007-0140117

(51) Int. Cl.
*H03H 11/26* (2006.01)
(52) U.S. Cl. .......... 327/269; 327/270; 327/271; 327/284
(58) Field of Classification Search .................. 327/161, 327/237, 269, 284
See application file for complete search history.

(56) References Cited

U.S. PATENT DOCUMENTS
6,760,803 B1 * 7/2004 Gauvin et al. ................ 710/305

FOREIGN PATENT DOCUMENTS
| JP | 2005-086379 | 3/2005 |
| JP | 10-051743 | 2/2008 |
| KR | 10-2001-00558 80 | 7/2001 |
| KR | 10-2006-00773 72 | 7/2006 |

* cited by examiner

*Primary Examiner* — Lincoln Donovan
*Assistant Examiner* — John W Poos
(74) *Attorney, Agent, or Firm* — Harness, Dickey & Pierce, P.L.C.

(57) ABSTRACT

A deskew system includes a first voltage control delay receiving a data signal and generating N-numbered delayed data signals obtained by delaying a phase of the data signal in units of 90/N, where N is a natural number that is not less than 1. In response to a phase control signal, a second voltage control delay receives a clock and generates N-numbered delayed clocks by delaying a phase of the clock in units of 90/N. A skew compensation control unit generates a plurality of skew control signals to compensate for skew between the data signal and the clock based on the data signal, the N-numbered delayed data signals, the clock, and the N-numbered delayed clocks.

18 Claims, 19 Drawing Sheets

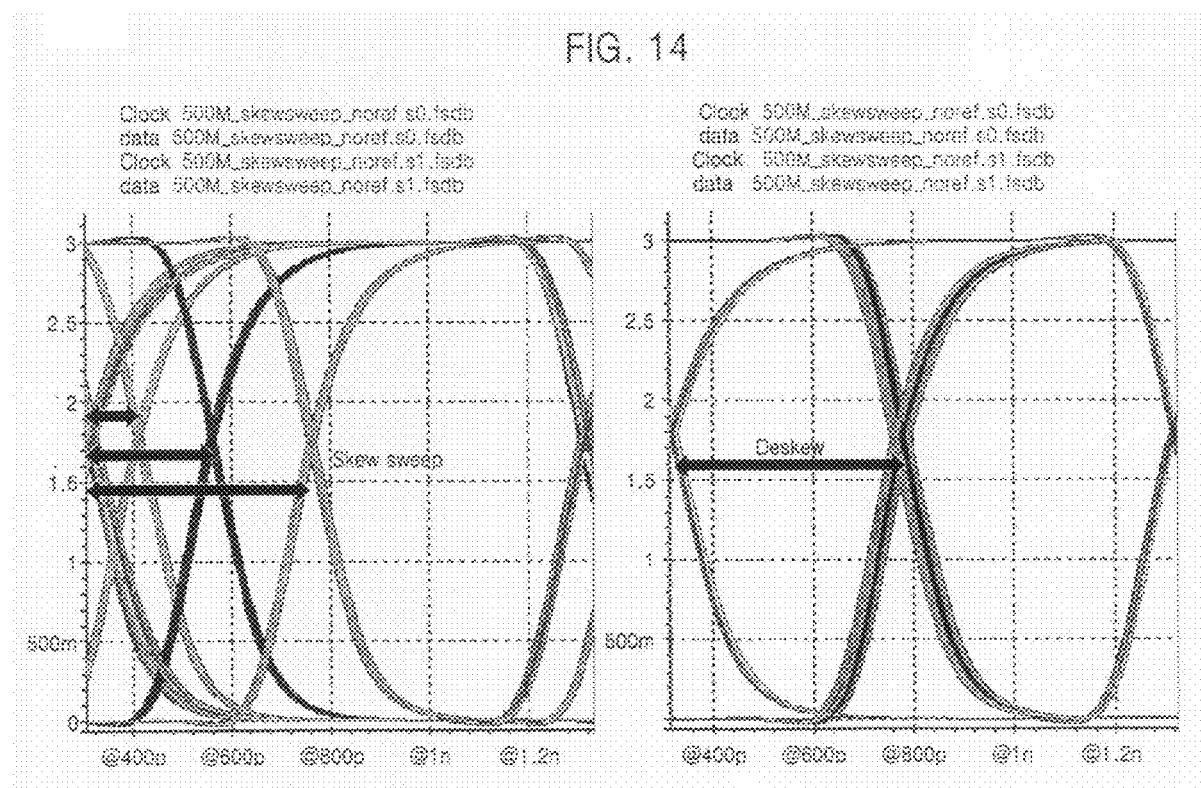

DESKEW SYSTEM FOR ELIMINATING SKEW BETWEEN DATA SIGNALS AND CLOCK AND CIRCUITS FOR THE DESKEW SYSTEM

BACKGROUND

1. Technical Field

Example embodiments relate to a deskew technique between data signals and clock, and more particularly, to a deskew system for eliminating skew between received data signals and clock, and circuits for the deskew system.

2. Description of Related Art

When serially transmitted data is received as parallel data in a data transmission system, skew is generated between the received data and a clock signal so that an error may be generated in data transmission. To eliminate the skew between the data and clock, a phase difference between data and clock is detected and a detected phase difference is compensated. The phase difference between data and clock is detected in a phase tracking method and a phase picking method.

FIG. 1A illustrates a phase tracking type sampling method. Referring to FIG. 1A, an ideal clock position and a change of a sampling value according to an increase or decrease of clock delay can be seen. According to the phase tracking method, tracking is performed to seek for the position of a desired clock based on a sampled signal.

The phase tracking method has a merit that a sampling method is simple but has a demerit in that sufficient data transition and loop locking time due to feedback are used. Recently, as a data transmission speed is rapidly increased, the phase picking method is mainly used to reduce a loss in data operation speed.

FIG. 1B illustrates a phase picking type sampling method. Referring to FIG. 1B, according to the phase picking method, the position of a desired clock may be determined and selected using the transition of an over-sampled signal. Thus, the phase picking method has a merit of reducing time for synchronization and a loss in data operation speed.

However, the phase picking method has demerits in that a phase delay range of clock for skew compensation is at least half of a cycle and a bit error rate increases when an over-sampling number for data is decreased to reduce the loss of data operation speed.

Also, in the phase picking method, data is sampled several times using a plurality of clocks having different phases and deskew is performed based on an accumulated sampling result. Thus, when the number of clocks for sampling and the frequency of sampling are increased to improve deskew performance, a chip size and power consumption are increased accordingly.

SUMMARY

Example embodiments provide a deskew system which can reduce the number of clocks for data sampling so that a chip size and power consumption are reduced and a resolution of skew compensation is increased, and circuits for the deskew system.

According to at least one example embodiment, a deskew system comprises a first voltage control delay, a second voltage control delay, and a skew compensation control unit. The first voltage control delay receives a data signal, generates N-numbered delayed data signals obtained by delaying a phase of the data signal in units of 90/N, where N is a natural number that is not less than 1, in response to a phase control signal, and outputs the data signal and the N-numbered delay data signals.

The second voltage control delay receives clock, generates N-numbered delayed clocks obtained by delaying a phase of the clock in units of 90/N, in response to the phase control signal, and outputs the clock and the N-numbered delayed clocks. The skew compensation control unit generates a plurality of deskew control signals to compensate for skew between the data signal and the clock based on the data signal, the N-numbered delayed data signals, the clock, and the N-numbered delayed clocks.

The first voltage control delay comprises N-numbered first delay cells, each receiving the data signal or a data signal output from a neighboring delay cell, delaying the received data signal for a time, and outputting a corresponding delayed data signal of the N-numbered delayed data signals, (N+1) numbered first buffers, each buffering a corresponding delayed data signal of the data signal or the N-numbered delayed data signals, and (N+1) numbered first duty compensation circuits, each compensating for a duty of a data signal output from a corresponding buffer of the (N+1) numbered first buffers.

The second voltage control delay comprises N-numbered second delay cells, each receiving the clock or clock output from a neighboring delay cell, delaying the received clock for a time, and outputting a corresponding delayed clock of the N-numbered delayed clocks, (N+1) numbered second buffers, each buffering a corresponding delayed clock of the clock or the N-numbered delayed clocks, and (N+1) numbered second duty compensation circuits, each compensating for a duty of a clock output from a corresponding buffer of the (N+1) numbered second buffers.

The skew compensation control unit comprises a sampling unit and a deskew control unit. The sampling unit samples the data signal at a first edge of each of the clock and the N-numbered delayed clocks, and a data signal having a phases delayed by 90° at a second edge of each of the clock and the N-numbered delayed clocks. The deskew control unit receives a sampling result output from the sampling unit, determines an amount of the skew between the data signal and the clock based on the sampling result, and generates a plurality of deskew control signals to compensate for the skew between the data signal and the clock based on the amount of the skew.

The deskew system further comprises a phase control unit receiving the clock and one of the N-numbered delay clocks and generating the phase control signal to maintain one of a phase difference between the clock and the received delayed clock and a phase difference between the data signal and the delayed data signal at a phase difference, wherein a delay time of each of the N-numbered first delay cells and the N-numbered second delay cells is adjusted in response to the phase control signal.

The phase control unit comprises a first logic operation unit, a first low pass filter, a second logic operation unit, a second low pass filter, and a comparison unit. The first logic operation unit receives the clock and a clock having a phase delayed by 90° and performing an exclusive OR operation on the clock and the clock having a phase delayed by 90°. The first low pass filter generates a comparison voltage based on a result of the exclusive logic OR operation on the clock and the clock having a phase delayed by 90°. The second logic operation unit receives the clock and generating a second clock based on the clock. The second low pass filter generates a reference voltage having a constant voltage level based on the second clock. The comparison unit receives and compares the comparison voltage and the reference voltage and generating the phase control signal based on phase control current generated based on a result of the comparison between the comparison voltage and the reference voltage.

Each of the (N+1) numbered first duty compensation circuits and the (N+1) numbered second duty compensation circuits comprises a third logic operation unit receiving a power voltage and a first output signal of the second differential transistor pair and performing a third logic operation on the received power voltage and the first output signal of the second differential transistor pair, and a fourth logic operation unit receiving the power voltage, a second output signal of the second differential transistor pair, and a result of the third logic operation, and performing a fourth logic operation on the received power voltage and the second output signal of the second differential transistor pair.

The third logic operation unit comprises a first sampling device sampling the power voltage in response to a first edge of the first output signal of the second differential transistor pair, and an inverter inverting an output signal of the first sampling device and outputting the third logic operation result, wherein the first sampling device is reset in response to the third logic operation result.

The fourth logic operation unit comprises a second sampling device sampling the power voltage in response to a first edge of the second output signal of the second differential transistor pair, and the second sampling device is reset in response to the third logic operation result.

The deskew system further comprises a data signal output unit outputting a deskewed data signal in response to the deskew control signals, and a clock output unit outputting a deskewed clock in response to the deskew control signals.

BRIEF DESCRIPTION OF THE DRAWINGS

The above and other features and advantages of the present invention will become more apparent by describing in detail example embodiments thereof with reference to the attached drawings in which:

FIG. 14 is a graph showing the result of a simulation of the output signal of a deskew system according to an example embodiment of the present invention when a clock frequency is 500 MHz and the amount of skew is variable.

DESCRIPTION OF EXAMPLE EMBODIMENTS

This application claims priority under 35 U.S.C. §119 to Korean Patent Application No. 10-2007-0140117, filed on 28 Dec. 2007, in the Korean Intellectual Property Office, the disclosure of which is incorporated herein by reference.

Figure 1A:
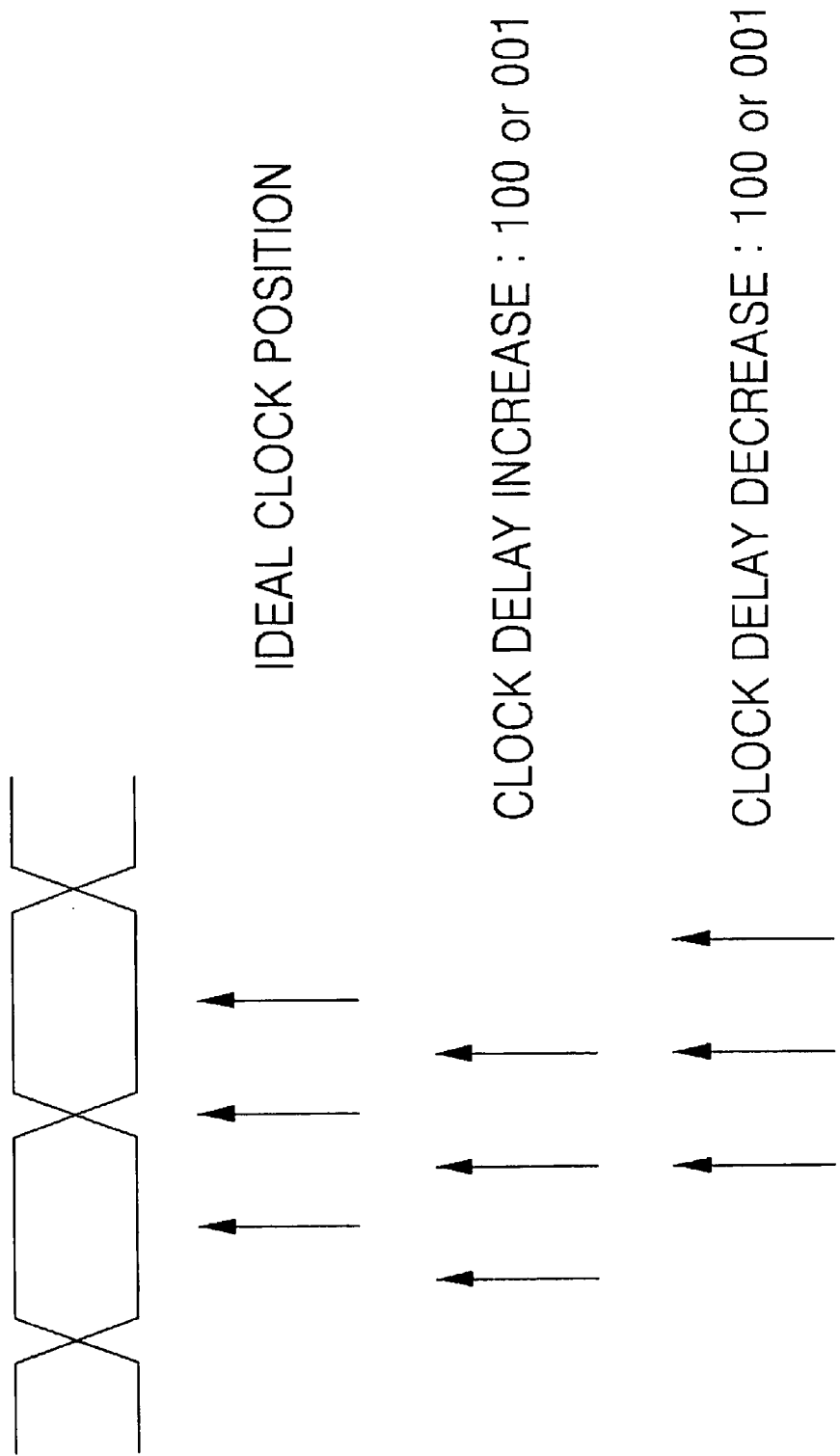
FIG. 1A illustrates a phase tracking type sampling method.
Figure 1B:
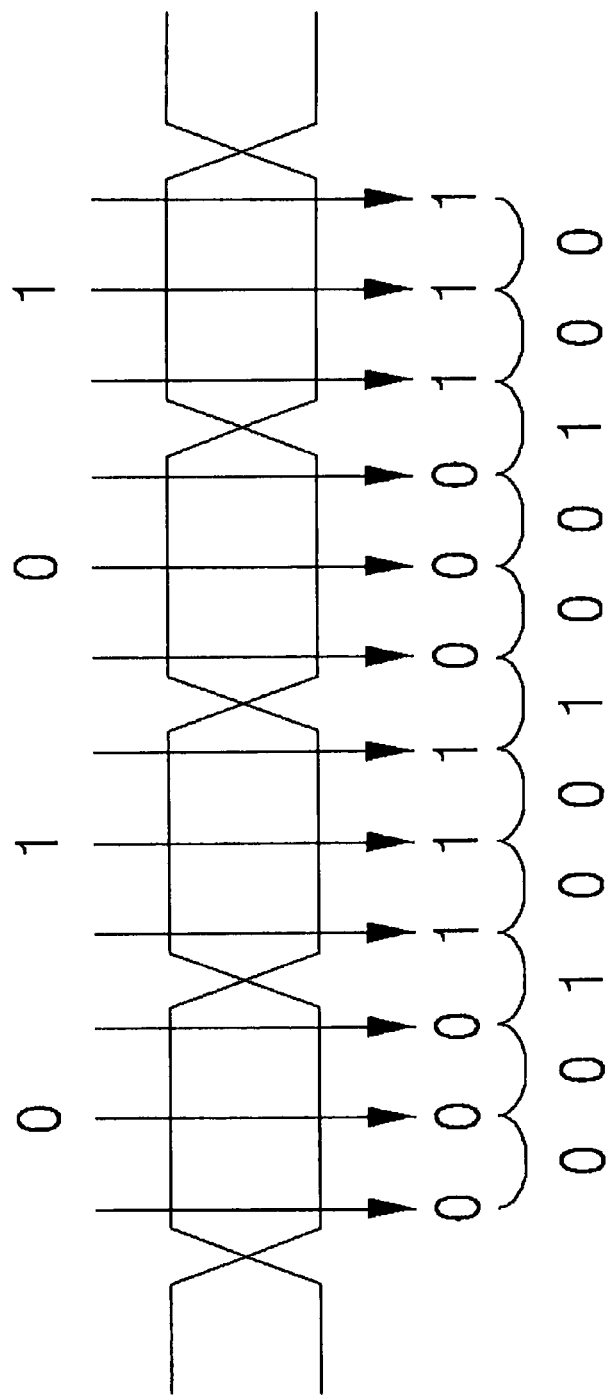
FIG. 1B illustrates a phase picking type sampling method.
Figure 2:
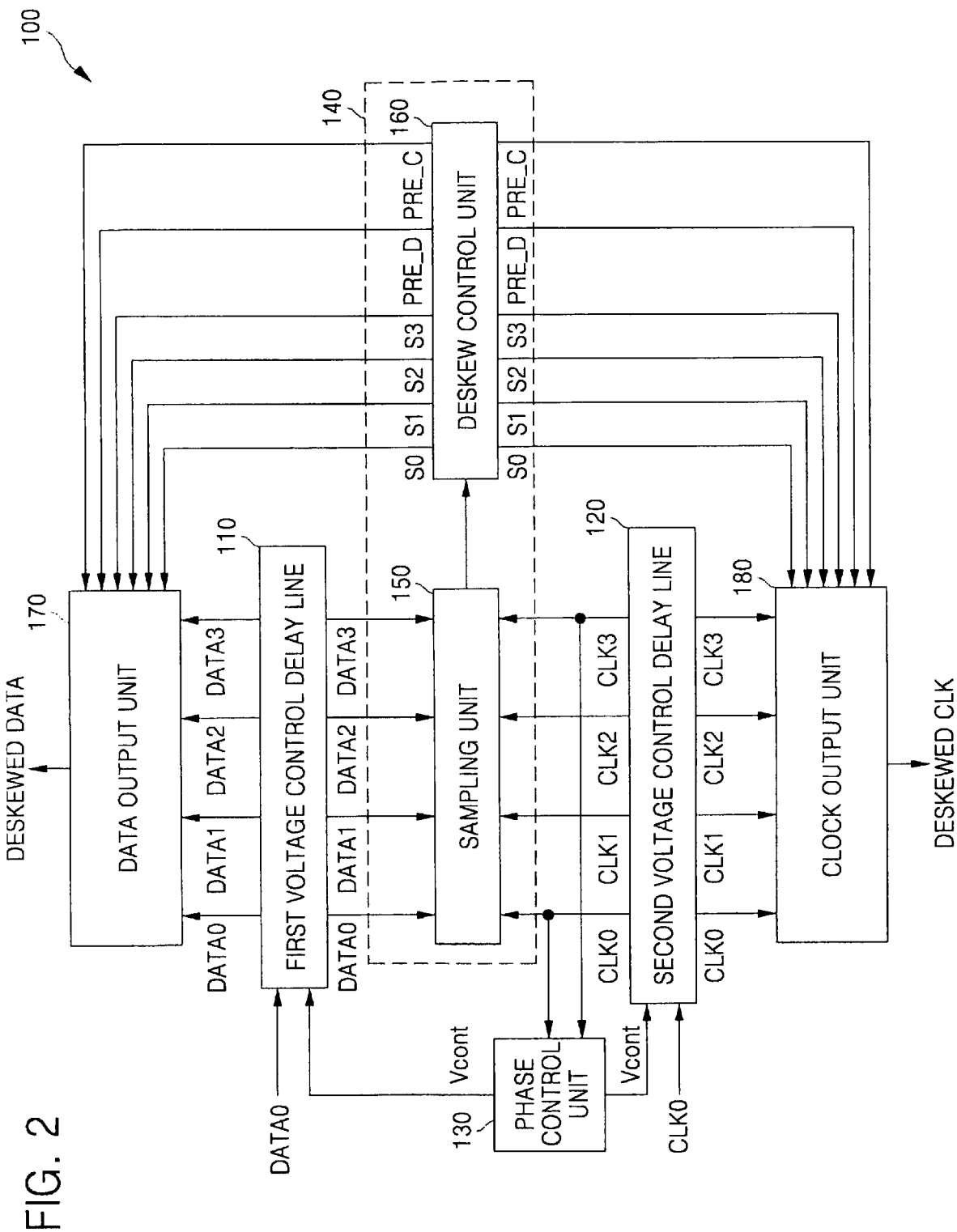
FIG. 2 illustrates the structure of a deskew system according to an example embodiment of the present invention.

Reference will now be made in detail to example embodiments, examples of which are illustrated in the accompanying drawings, wherein like reference numerals refer to the like elements throughout. The embodiments are described below in order to explain the present invention by referring to the figures. FIG. 2 illustrates the structure of a deskew system 100 according to an example embodiment of the present invention. Referring to FIG. 2, the deskew system 100 includes a first voltage control delay 110, a second voltage control delay 120, a phase control unit 130, a skew compensation control unit 140, a data output unit 170, and a clock output unit 180.

The first voltage control delay 110 receives a data signal DATA0, generates N-number of delayed data signals DATA1, DATA2, and DATA3 by delaying a phase of the data signal DATA0 in units of 90/N, where "N" is a natural number that is not less than 1, and outputs the data signal DATA0 and the N-number of delayed data signals DATA1, DATA2, and DATA3. Although in the present example embodiment "N" is 3, the present invention is not limited thereto.

Figure 3:
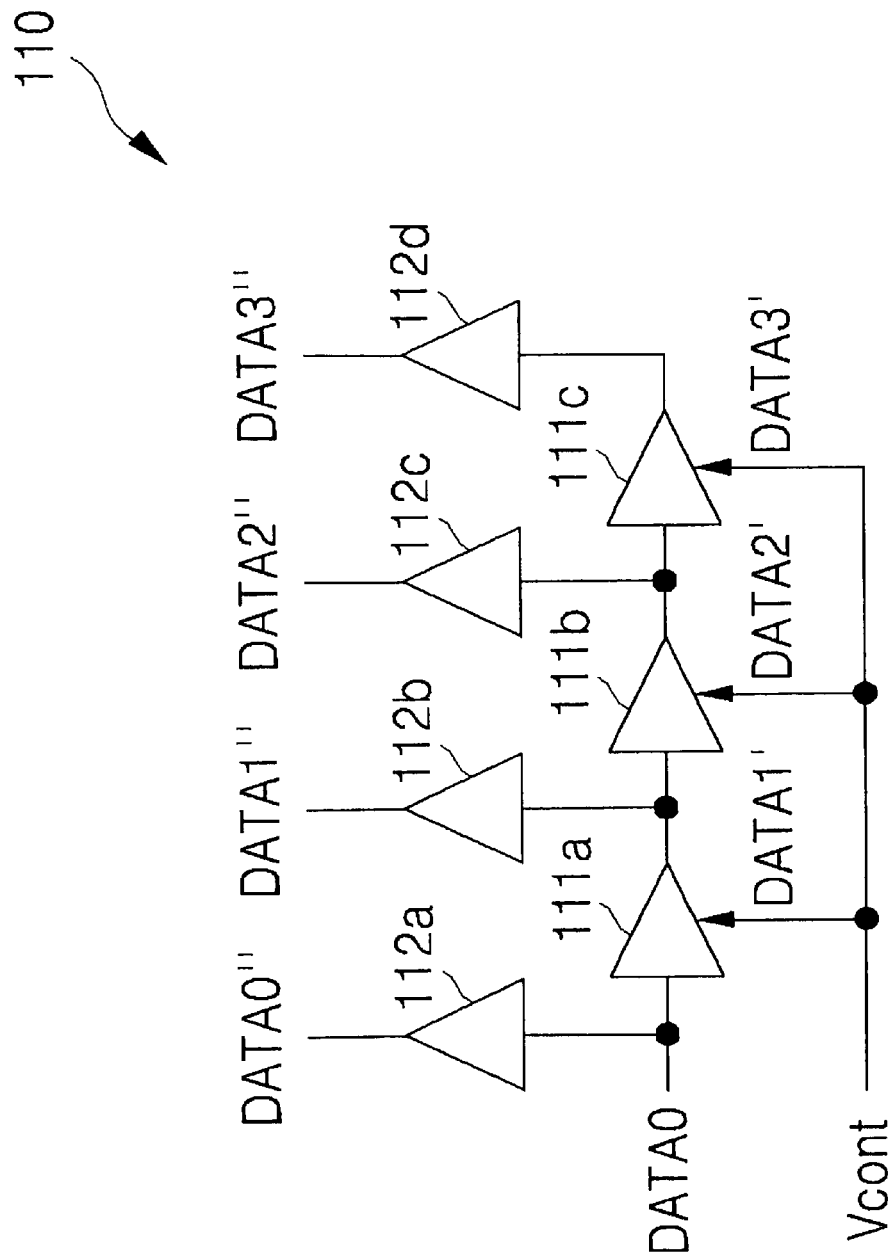
FIG. 3 is a circuit diagram of three first delay cells and four first buffers, constituting the first voltage control delay of FIG. 2.

FIG. 3 is a circuit diagram of three first delay cells 111a, 111b, and 111c and four first buffers 112a, 112b, 112c, and 112d, constituting the first voltage control delay 110 of FIG. 2. Referring to FIG. 3, the three first delay cells 111a, 111b, and 111c all may have the same delay time, that is, the same phase delay, for example, 30°. The four first buffers 112a, 112b, 112c, and 112d all may have the same delay time.

In the present specification, signal delay due to buffering is disregarded for a signal buffered by a buffer unless described otherwise. Thus, although a separate circuit, for example, a buffer for time delay, to compensate for a time delay difference due to buffering between a data signal and a delay data signal may be used, a description thereof will be omitted herein.

Each of the three first delay cells 111a, 111b, and 111c receives the data signal DATA0 or a data signal DATA1' or DATA2' output from a neighboring delay cell, delays the data signal DATA0 or the data signal DATA1' or DATA2' for a period of time, and outputs a corresponding delayed data signal of the three delayed data signals DATA1", DATA2", and DATA3".

Each of the four first buffers 112a, 112b, 112c, and 112d buffers a corresponding data signal of the data signal DATA0 or the three delayed data signals DATA1', DATA2', and DATA3'. The data signals output from the three first delay cells 111a, 111b, and 111c are indicated as DATAx'(x=1, 2, 3). And the delayed data signals output from the four first buffers 112a, 112b, 112c, and 112d are indicated as DATAx" (x=1, 2, 3). In the present specification, it is assumed that the data signals DATAx' and DATAx" that are buffered by buffers are the same signals as DATAx regardless of the signal delay.

Figure 4:
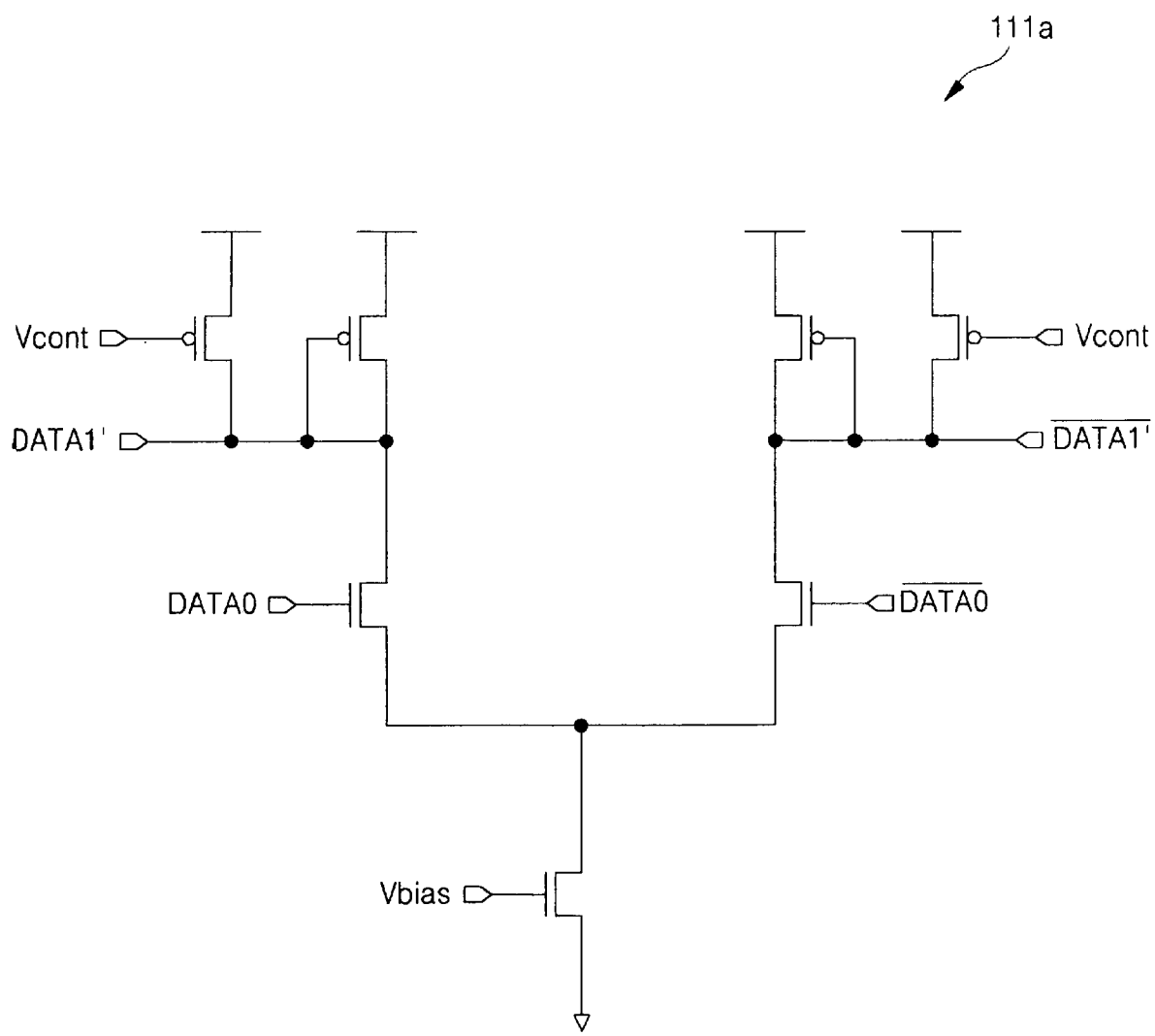
FIG. 4 is a circuit diagram of the first delay cell of FIG. 3.

FIG. 4 is a circuit diagram of the first delay cell 111a of FIG. 3. Referring to FIG. 4, the first delay cell 111a may be embodied by a differential delay cell driven in response to the data signal DATA0. In FIG. 3, complementary data signals $\overline{DATA0}$ and $\overline{DATA1'}$ that are output from the first delay cell 111a and the first buffer 112b are not illustrated.

The first delay cell 111a includes a pair of differential transistors driven in response to the received data signal DATA0 and a load unit having an impedance value varying based on a phase control signal Vcont. The delay time of the first delay cell 111a may be adjusted based on the amount of current flowing through the differential transistors that varies based on the impedance value of the load unit. In other words, the delay time may vary as the common level Vcom of the output signal DATA1' and $\overline{DATA1'}$ of the first delay cell 111a is varied by the phase control signal Vcont.

The output signals DATA1' and $\overline{DATA1'}$ of the first delay cell 111a are buffered by the first corresponding buffer 112b of the four first buffers 112a, 112b, 112c, and 112d. The first buffer 112b may be an inverter buffer as in the present example embodiment. Since the common level Vcom of the output signal of the first delay cell 111a and the level of a logic threshold voltage Vlt of the first buffer 112b may be different from each other, the duty ratio of a signal passing through the first buffer 112b may not be maintained at 50%.

Figure 5A:
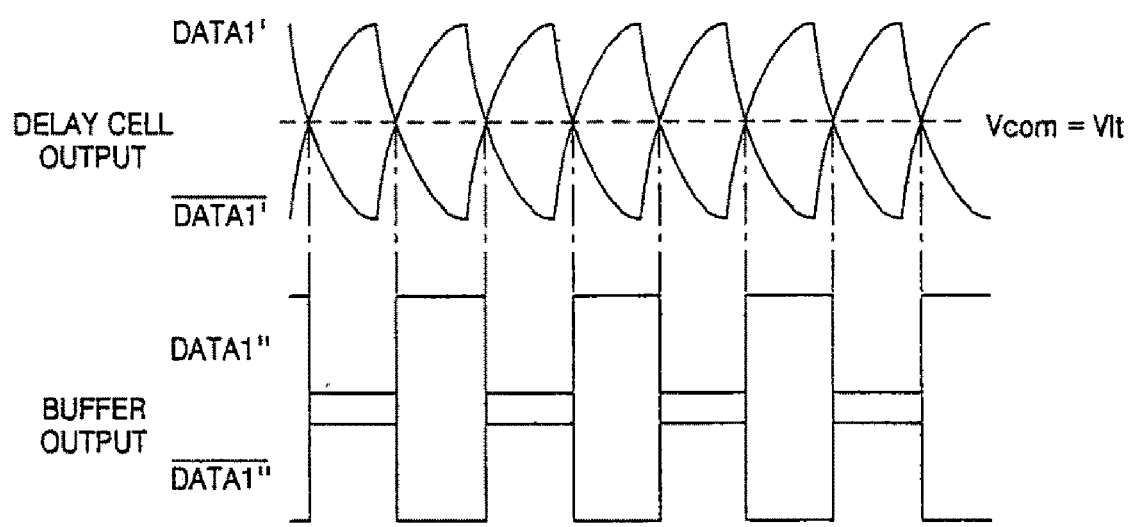
FIG. 5A illustrates the output signal of the first buffer when the common level of the first delay cell output signal is the same as the logic threshold voltage level of the first buffer.

FIG. 5A illustrates the output signals DATA1" and $\overline{DATA1"}$ of the first buffer 112b when the common level Vcom of the output signal of the first delay cell 111a is the same as the level of the logic threshold voltage Vlt of the first buffer 112b. Referring to FIG. 5A, when the common level Vcom of the output signal of the first delay cell 111a and the level of the logic threshold voltage Vlt of the first buffer 112b are the same, the duty ratio of the output signals DATA1" and $\overline{DATA1"}$ of the first buffer 112b is maintained at 50%.

Figure 5B:
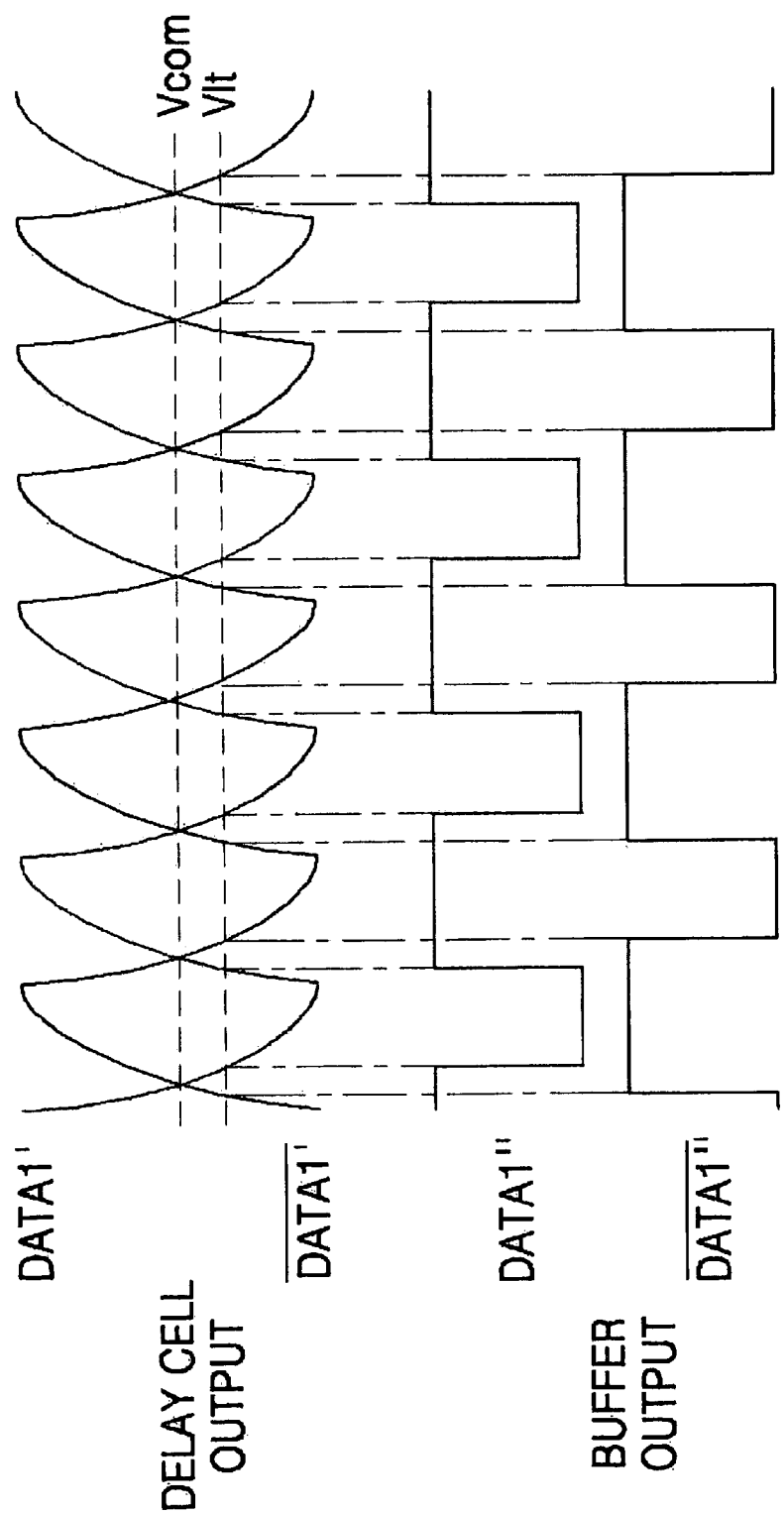
FIG. 5B illustrates the output signal of the first buffer when the common level of the first delay cell output signal is higher than the logic threshold voltage level of the first buffer.
Figure 5C:
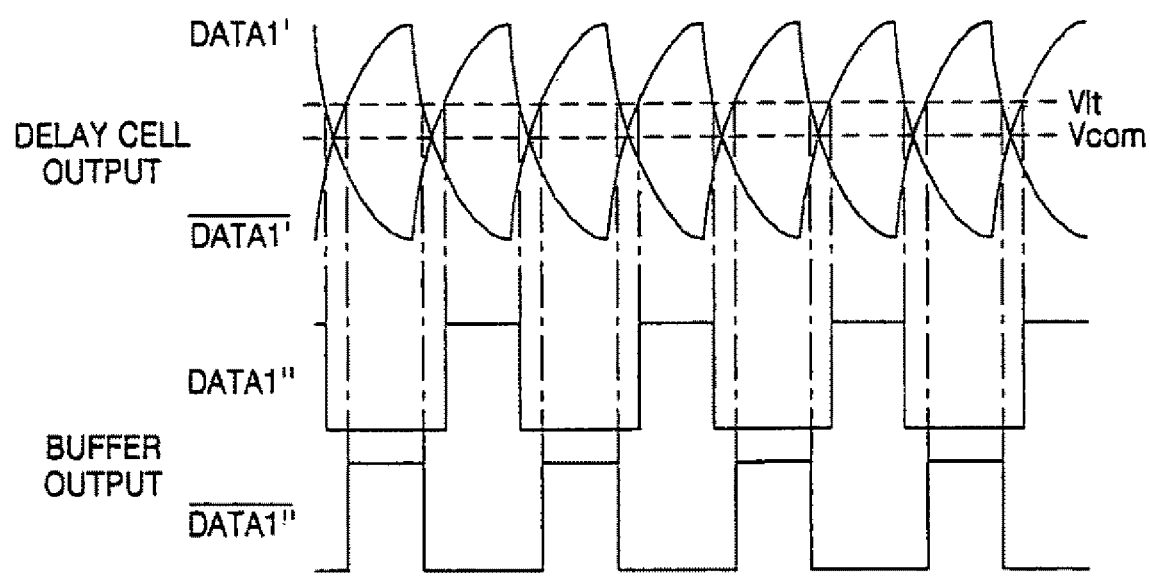
FIG. 5C illustrates the output signal of the first buffer when the common level of the first delay cell output signal is lower than the logic threshold voltage level of the first buffer.

FIG. 5B illustrates the output signals DATA1" and $\overline{DATA1"}$ of the first buffer 112b when the common level Vcom of the output signal of the first delay cell 111a is higher than the level of the logic threshold voltage Vlt of the first buffer 112b. FIG. 5C illustrates the output signals DATA1" and $\overline{DATA1"}$ of the first buffer 112b when the common level Vcom of the output signal of the first delay cell 111a is lower than the level of the logic threshold voltage Vlt of the first buffer 112b.

Referring to FIGS. 5B and 5C, when the common level Vcom of the output signal of the first delay cell 111a and the level of the logic threshold voltage Vlt of the first buffer 112b are different from each other, the duty ratio of the output signals DATA1" and $\overline{DATA1"}$ of the first buffer 112b may not be maintained at 50%. Thus, a duty compensation circuit to maintain the duty ratio of the output signal of the first buffer 112b at 50% is used.

Figure 5D:
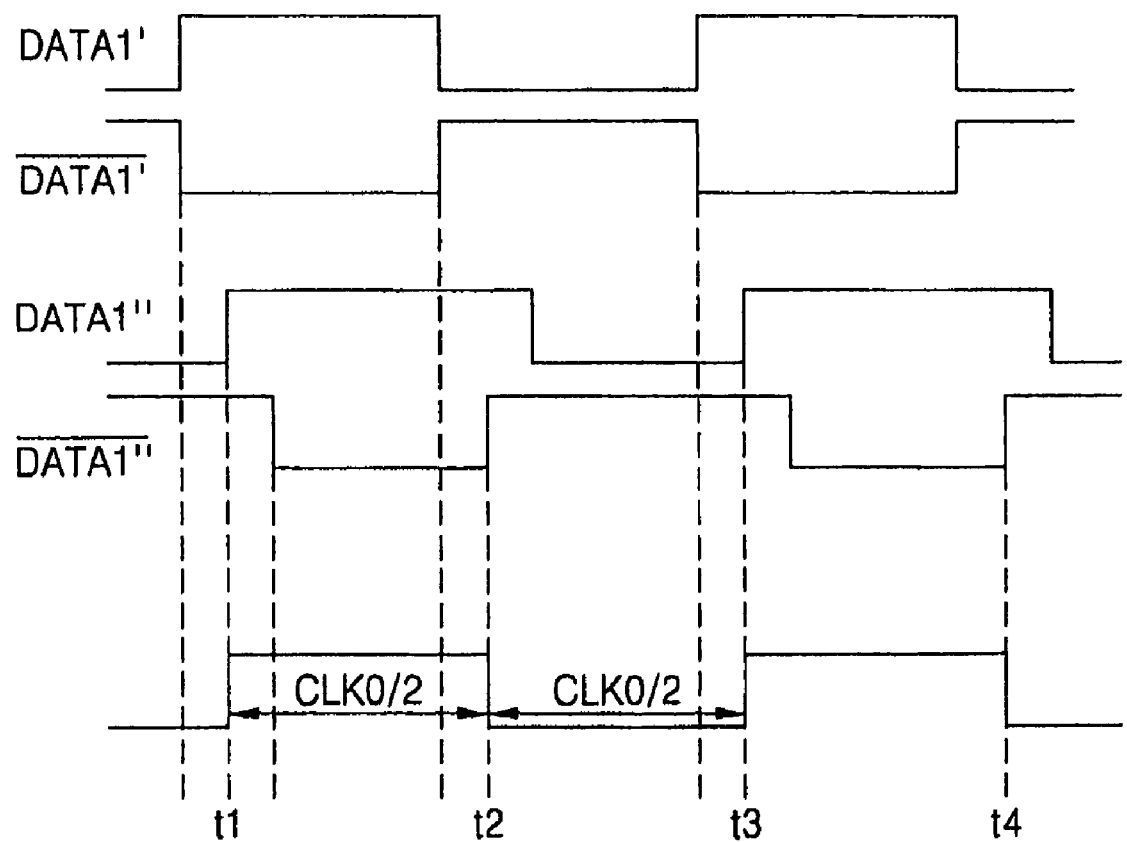
FIG. 5D illustrates the output signal of the first buffer when a duty ratio of 50% is not kept.

FIG. 5D illustrates the output signal of the first buffer 112b when a duty ratio of 50% is not kept. Referring to FIG. 5D, it can be seen that an interval between a first edge, for example, a rising edge, of the complementary output signal $\overline{DATA1"}$ of the first buffer 112b (hereinafter, referred to as the first output signal of the differential transistor pair) and the first edge of a output signal DATA1" (hereinafter, referred to as the second output signal of the differential transistor pair) is ½ of a clock signal CLK0. The duty compensation circuit maintains the duty ratio of the output signals DATA1" and $\overline{DATA1"}$ of the first buffer 112b at 50% using the above characteristic. The first voltage control delay 110 may further include four first duty compensation circuits 113 respectively connected to the four first buffers 112a, 112b, 112c, and 112d.

Figure 6:
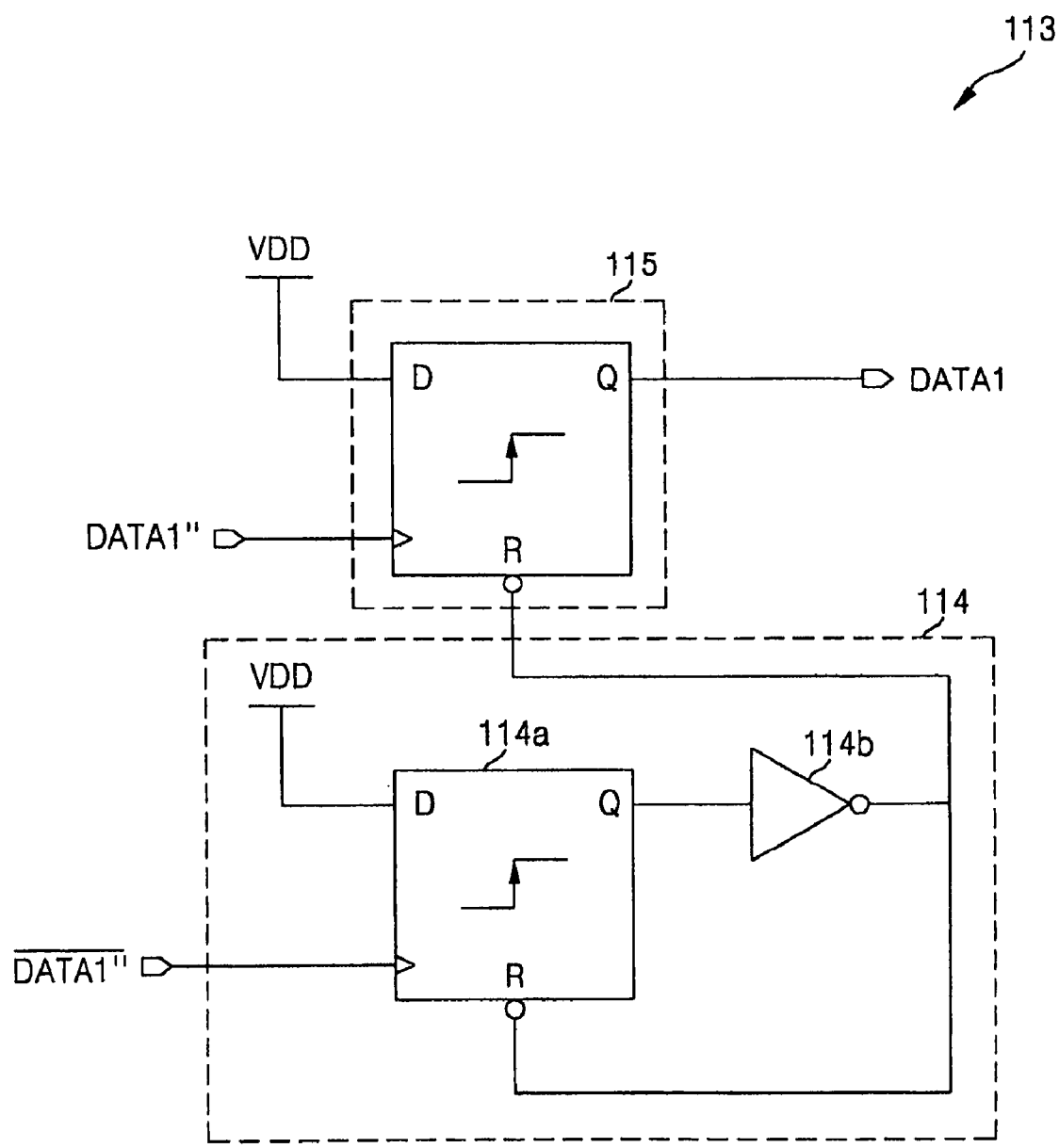
FIG. 6 is a circuit diagram of the first duty compensation circuit included in the first voltage control delay.

FIG. 6 is a circuit diagram of the first duty compensation circuit 113 included in the first voltage control delay 110. Referring to FIG. 6, the first duty compensation circuit 113 compensates for the duty of the data signals DATA1" and $\overline{DATA1"}$ output from a corresponding buffer of the four first buffers 112a, 112b, 112c, and 112d.

In FIG. 6, the first duty compensation circuit 113 includes a first logic operation unit 114 and a second logic operation unit 115. The first logic operation unit 114 receives a power voltage VDD and the first output signal $\overline{DATA1"}$ of the differential transistor pair and performs a logic operation on the power voltage VDD and the first output signal $\overline{DATA1"}$ of the differential transistor pair. In the present example embodiment, the power voltage VDD indicates a first logic value, for example, a logic value "1".

The second logic operation unit 115 receives the power voltage VDD, the second output signal DATA1" of the differential transistor pair, and the first logic operation result and performs a logic operation on the power voltage VDD and the second output signal DATA1" of the differential transistor pair based on the first logic operation result.

The first logic operation unit 114 includes a first sampling device 114a and an inverter 114b. The first sampling device 114a may sample the power voltage VDD in response to the first edge, for example, a rising edge, of the first output signal $\overline{DATA1"}$ of the differential transistor pair. The inverter 114b inverts an output signal of the first sampling device 114a and outputs an inverted signal.

The second logic operation unit 115 includes a second sampling device 115 sampling the power voltage VDD in response to the first edge of the second output signal DATA1" of the differential transistor pair. Each of the first logic operation unit 114 or the second logic operation unit 115 may further include a separate device to make the time delay of input and output signals to be the same.

Each of the second sampling device 115 and the first sampling device 114a may be reset in response to the first logic operation result. For example, each of the second sampling device 115 and the first sampling device 114a may be embodied by a flip-flop that is reset in response to the first logic operation result.

The duty compensation operation of the first duty compensation circuit 113 will be described below in detail with reference to FIGS. 5D and 6. The second logic operation unit 115 samples the power voltage VDD at the rising edge of the second output signal DATA1" of the differential transistor pair. The power voltage VDD always has a logic value "1". Accordingly, when a reset signal is not applied, the output signal of the second logic operation unit 115 after the first rising edge t1 of the second output signal DATA1" of the differential transistor pair is always a logic value "1".

The output signal of the first logic operation unit 114 is applied, as a reset signal, to the second logic operation unit 115 and the first sampling device 114a. The first sampling unit 114a outputs a logic value "1" after the first rising edge t2 of the first output signal $\overline{DATA1"}$ of the differential transistor pair that is a complementary signal of the second output signal DATA1" of the differential transistor pair.

Then, the inverter 114b outputs a logic value "0" by inverting a logic value "1" that is an output signal of the first sampling unit 114a. Each of the first sampling unit 114a and the second sampling unit 115 is reset in response to a logic value "0" and outputs the logic value "0".

The logic value "0" output from the first sampling unit 114a that is reset is inverted by the inverter 114b and maintains a logic value "1" so that the output of the first sampling unit 114a and the second sampling unit 115 is not affected until a second rising edge t3 of the second output signal DATA1" of the differential transistor pair.

Next, the second sampling unit 115 outputs a logic value "1" again at the second rising edge t3 of the second output signal DATA1" of the differential transistor pair and a logic value "0" again at a second rising edge t4 of the first output signal $\overline{\text{DATA1}}$" of the differential transistor pair. The duty of the output signal of the second logic operation unit 115 is maintained at 50%.

The second voltage control delay 120 receives the clock CLK0, generates three delayed clocks CLK1, CLK2, and CLK3 that are obtained by delaying the phase of the clock CLK0 by a unit of 90°/3, that is, 30°, and outputs the clock CLK0 and the three delayed clocks CLK1, CLK2, and CLK3.

The second voltage control delay 120 includes three second delay cells (not shown) and four second buffers (not shown), like the first voltage control delay 110. Since the second voltage control delay 120 is similar to the first voltage control delay 110, except for the input signal of the clock CLK0 or the data signal DATA0, a detailed description of the second voltage control delay 120 will be omitted herein.

The phase control unit 130 receives the clock CLK3 having a phase delayed 90° from that of the clock CLK0 and generates the phase control signal Vcont used to maintain the phase difference between the clock CLK0 and the clock CLK3 having the 90° delayed phase, at 90°, based on the clock CLK0 and the clock CLK3 having the 90° delayed phase.

Thus, each of the three second delay cells and the three first cells 111a, 111b, and 111c delays the received clock and the received data signal for a time based on the phase control signal Vcont so that the phase of the received clock and the data signal may be delayed by 30°.

The first duty compensation circuit 113 included in the first voltage control delay 110 and the second voltage control delay 120 of the deskew system 100 according to the present example embodiment may be used not only in the deskew system but also in other systems using a particular signal having a duty ratio that is maintained constant.

Figure 7:
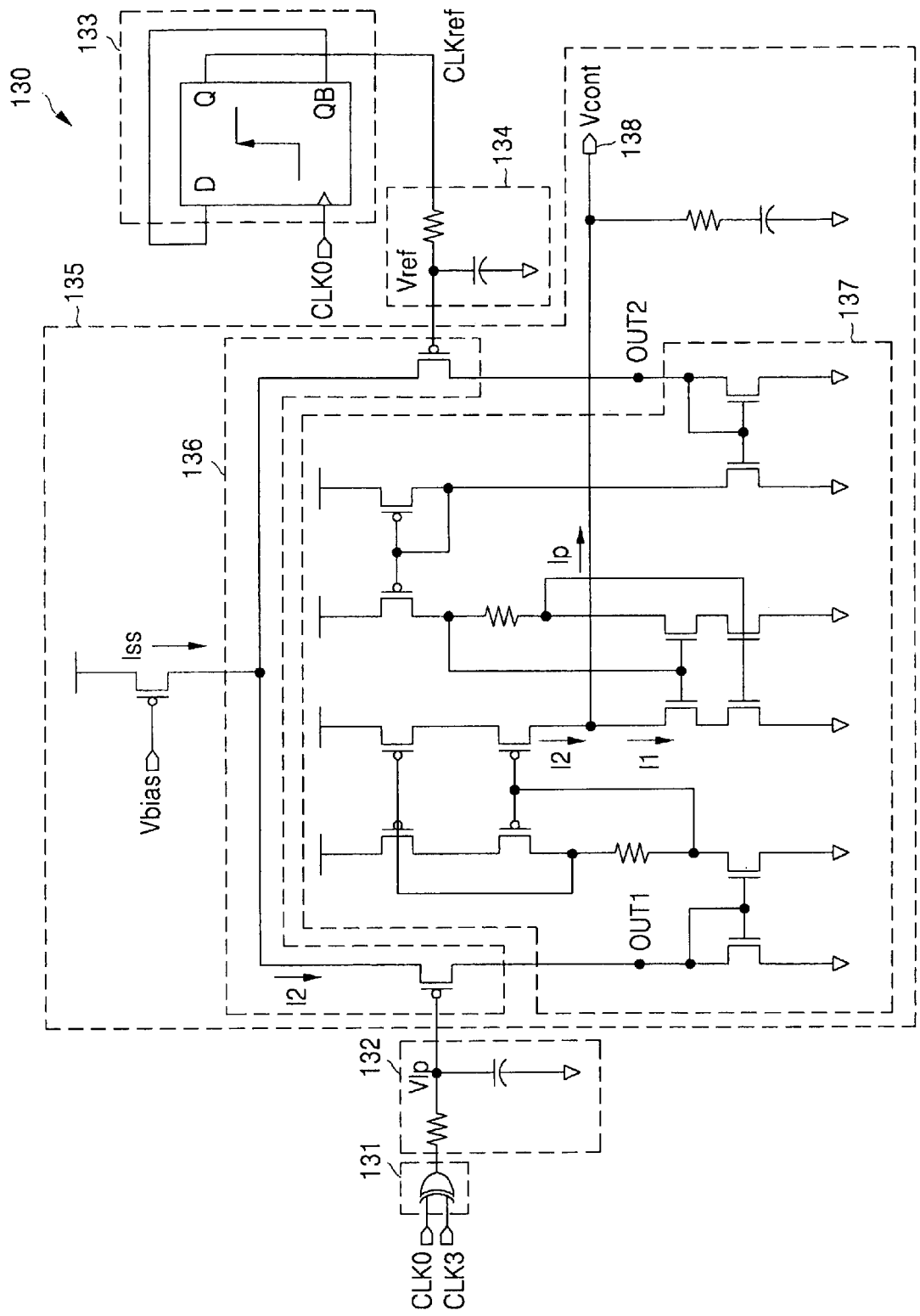
FIG. 7 is a circuit diagram of the phase control unit of FIG. 2.

FIG. 7 is a circuit diagram of the phase control unit 130 of FIG. 2. Referring to FIG. 7, the phase control unit 130 receives the clock CLK0 and one of the three delayed clocks CLK1, CLK2, and CLK3 and generates a phase control signal Vcont to maintain one of a phase difference between the clock CLK0 and one of the received delayed clocks CLK1, CLK2, and CLK3 and a phase difference between the data signal DATA0 and one of the delayed data signals DATA1, DATA2, DATA3, at a phase difference, for example, 90°, based on the clock CLK0 and the received delayed clocks CLK1, CLK2, and CLK3. Then. The delay time of each of the three first delay cells 111a, 111b, and 111c and the three second delay cells may be adjusted in response to the phase control signal Vcont. The phase control signal Vcont may be generated based on the data signal DATA and one of the delayed data signals DATA1, DATA2, DATA3.

Referring to FIG. 7, the phase control unit 130 includes a third logic operation unit 131, a first low pass filter 132, a fourth logic operation unit 133, a second low pass filter 134, and a comparison unit 135. The third logic operation unit 131 receives the clock CLK0 and the clock CLK3 having a phase delayed by 90° and performs an exclusive OR operation on the clock CLK0 and the clock CLK3 having a phase delayed by 90°. The first logic operation unit 131 may be embodied by an exclusive OR gate.

The first low pass filter 132 generates a comparison voltage Vlp based on a result of the exclusive OR operation on the clock CLK0 and the clock CLK3 having a phase delayed by 90°. In other words, the first low pass filter 132 generates the comparison voltage Vlp by taking an average of the result of the exclusive OR operation.

The fourth logic operation unit 133 receives the clock CLK0 and generates a second clock CLKref based on the clock signal CLK0. The second clock CLKref may be a signal toggled in synchronization with the first edge, for example, a rising edge, of the clock CLK0. As shown in FIG. 7, the fourth logic operation unit 133 may be embodied by a flip-flop.

The second low pass filter 134 generates a reference voltage Vref having a constant voltage level based on the second clock CLKref. In other words, the second low pass filter 134 generates the reference voltage Vref by taking an average of the second clock CLKref. Since the second clock CLKref is a signal toggled in synchronization with the first edge of the clock CLK0, assuming that a high level of the clock CLK0 is the power voltage VDD, the level of the reference voltage Vref is VDD/2.

The comparison unit 135 receives the comparison voltage Vlp and the reference voltage Vref and generates the phase control signal Vcont based on a phase control current Ip generated based on a result of the comparison between the comparison voltage Vlp and the reference voltage Vref. The comparison unit 135 includes a differential transistor pair 136 having a first differential transistor and a second differential transistor, a plurality of current mirror circuits 137, and an output terminal 138. Each of the differential transistor pair 136 receives the comparison voltage Vlp and the reference voltage Vref.

The current mirror circuits 137 are connected between a first output terminal OUT1 and a second output terminal OUT2 of the differential transistor pair 136 and generates phase control current Ip based on current I1 flowing in the first differential transistor and current I2 flowing in the second differential transistor. The output terminal 138 outputs the phase control signal Vcont having a voltage level varying based on charge or discharge by the phase control current Ip.

In the operation of the phase control unit 130, the first low pass filter 132 takes an average of the result of the exclusive OR operation output from the third logic operation unit 131. When the voltage level of the high level of the clock CLK0 is assumed to be the level of the power voltage VDD, the phase difference between the clock CLK0 and the clock CLK3 having a phase delayed by 90° is maintained at 90° so that the level of the comparison voltage Vlp is the same as the half of the power voltage (VDD/2).

However, when the phase difference between the clock CLK0 and the clock CLK3 having a phase delayed by 90° is less than 90°, the level of the comparison voltage Vlp is lower than the half of the power voltage (VDD/2). When the phase difference between the clock CLK0 and the clock CLK3 having a phase delayed by 90° is greater than 90°, the level of the comparison voltage Vlp is higher than the half of the power voltage (VDD/2).

The reference voltage Vref is an output voltage that is obtained by averaging the signal toggled at the rising edge of the clock CLK0 in the second low pass filter 134. Thus, the level of the reference voltage Vref is maintained at the half of the power voltage (VDD/2) regardless of the duty ratio of the clock CLK0. The phase control current Ip flowing in the output terminal 138 is determined to be I2−I1 (Ip=I2−I1) according to the current I1 flowing in the first differential transistor and the current I2 flowing in the second differential transistor that are copied by the current mirror circuit 137.

When the phase difference between the clock CLK0 and the clock CLK3 having a phase delayed by 90° is 90°, both of the level of the comparison voltage Vlp and the level of the reference voltage Vref are VDD/2. Accordingly, the amount of the I1 and the amount of I2 are the same so that current does not flow in the output terminal 138.

When the phase difference between the clock CLK0 and the clock CLK3 having a phase delayed by 90° is less than 90°, the level of the comparison voltage Vlp is lower than VDD/2. Accordingly, the amount of the I2 is larger than the amount of I1 so that the output terminal 138 is charged with charges.

When the phase difference between the clock CLK0 and the clock CLK3 having a phase delayed by 90° is greater than 90°, the level of the comparison voltage Vlp is higher than VDD/2. Accordingly, the amount of the I2 is less than the amount of I1 so that the phase control current Ip has a negative value and the charges are discharged from the output terminal 138.

Figure 8:
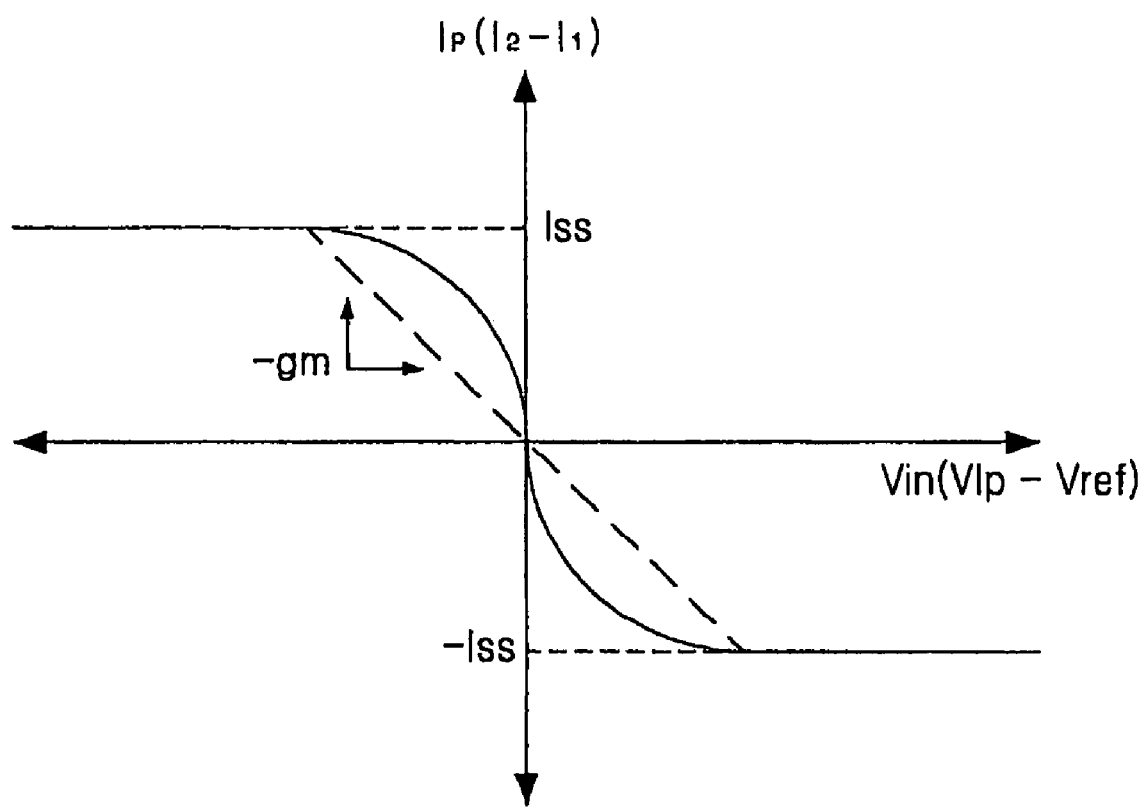
FIG. 8 is a graph showing a change in phase control current according to input voltages of the comparison unit of FIG. 7.

FIG. 8 is a graph showing a change in the phase control current Ip according to the input voltages Vlp and Vref of the comparison unit 135. Referring to FIG. 8, when the level of the comparison voltage Vlp is the same as the level of the reference voltage Vref, the phase control current Ip is 0. This shows that the phase control unit 130 is in a locking state due to the feedback operation of a loop formed between the phase control unit 130 and the second voltage control delay 120.

Also, when the level of the comparison voltage Vlp is lower than the level of the reference voltage Vref, the phase control current Ip converges into a bias current Iss. When the level of the comparison voltage Vlp is higher than the level of the reference voltage Vref, the phase control current Ip converges into a negative bias current −Iss. As described above, the phase control voltage Vcont finally is maintained at a constant voltage level based on the charge/discharge of the output terminal 138 by the phase control current Ip.

The phase delays of the first delay cells 111a, 111b, and the 111c and the second delay cells of the second voltage control delay 120 are determined based on the phase control voltage Vcont. Accordingly, the phase difference between the data signal DATA0 and the data signal DATA3 having a phased delayed by 90° and the phase difference between the clock CLK0 and the clock CLK3 having a phased delayed by 90° are maintained 90°.

The phase control circuit according to the combination of the phase control unit 130 and the second voltage control delay 120 of the deskew system 100 according to an example embodiment of the present invention may be used in other systems in which the phase difference between signals is maintained at a phase difference.

The skew compensation control unit 140 compensates for skew between the data signal DATA0 and the clock CLK0 based on the three delayed data signals DATA1, DATA2, and DATA3, the clock CLK0, and the three delayed clocks CLK1, CLK2, and CLK3. Referring to FIG. 2, the skew compensation control unit 140 includes a sampling unit 150 and a deskew control unit 160 (please refer to FIG. 2).

The sampling unit 150 samples the data signal DATA0 at the first edge, for example, a rising edge, of each of the clock CLK0 and the three delayed clocks CLK1, CLK2, and CLK3 and the data signal DATA3 having a phase delayed by 90° at the second edge, for example, a falling edge, of each of the clock CLK0 and the three delayed clocks CLK1, CLK2, and CLK3.

The deskew control unit 160 receives a result of the sampling output from the sampling unit 150, determines the amount of skew between the data signal DATA0 and the clock CLK0 based on the sampling result, and generates a plurality of deskew control signals S0, S1, S2, S3, PRE_D, and PRE_C to compensate for the skew between the data signal DATA0 and the clock CLK0 based on the amount of skew.

Figure 9:
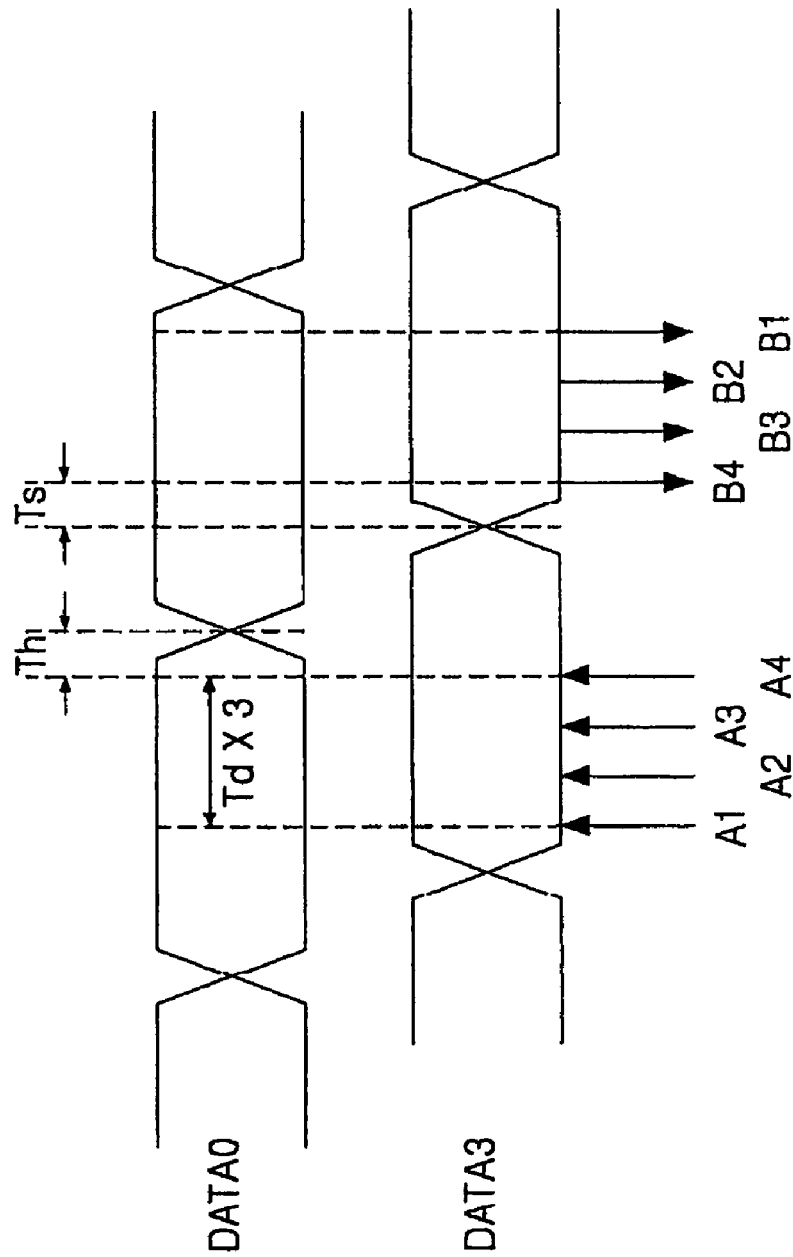
FIG. 9 is a timing diagram showing the sampling operation of the sampling unit of FIG. 2.

FIG. 9 is a timing diagram showing the sampling operation of the sampling unit 150 of FIG. 2. In FIG. 9, A1 indicates a rising edge of the clock CLK0 and A2, A3, and A4 respectively indicate rising edges of the clocks CLK1, CLK2, and CLK3 having the delayed phases. B1 indicates a falling edge of the clock CLK0 and B2, B3, and B4 respectively indicate falling edges of the clocks CLK1, CLK2, and CLK3 having the delayed phases. "Td" denotes a delay time between the neighboring clocks. "Th" denotes a hold time of the sampling unit 150. "Ts" denotes a set-up time of the sampling unit 150.

Referring to FIG. 9, the data DATA0 is sampled at the rising edge of the each of the clock CLK0 and the clocks CLK1, CLK2, and CLK3 having the delayed phases. The data DATA3 having a phase delayed by 90° is sampled at the falling edge of the each of the clock CLK0 and the clocks CLK1, CLK2, and CLK3 having the delayed phases.

Table 1 shows sampling values of the sampling unit 150 and the deskew control signals S0, S1, S2, S3, PRE_D, and PRE_C output from the deskew control unit 160 according to the position of the clock CLK0.

TABLE 1

| Position of Clock | A1 | A2 | A3 | A4 | B4 | B3 | B2 | B1 | | Deskew Control Signal |
|---|---|---|---|---|---|---|---|---|---|---|
| Ideal Case | 0 | 0 | 0 | 0 | 1 | 1 | 1 | 1 | S0 | Don't care |
| When data is earlier | 0 | 0 | 0 | 1 | 1 | 1 | 1 | 1 | S1 | PRE_D |
|  | 0 | 0 | 1 | 1 | 1 | 1 | 1 | 1 | S2 |  |
|  | 0 | 1 | 1 | 1 | 1 | 1 | 1 | 1 | S3 |  |
| When clock is earlier | 0 | 0 | 0 | 0 | 1 | 1 | 1 | 1 | S1 | PRE_C |
|  | 0 | 0 | 0 | 0 | 0 | 1 | 1 | 1 | S2 |  |
|  | 0 | 0 | 0 | 0 | 0 | 0 | 1 | 1 | S3 |  |

Referring to Table 1, when the position of the clock CLK0 is ideal, the sampling value of A1-A4 is 0 and the sampling value of B1-B4 is 1. However, when the phase of the data DATA0 is earlier than the phase of the clock CLK0, the sampling value is 1 in order of A4, A3, and A2. When the phase of the clock CLK0 is earlier than the phase of the data DATA0, the sampling value is 0 in order of B4, B3, and B2.

S0 is a deskew control signal indicating that deskew is not used because the position of the clock CLK0 is ideal. S1-S3 are a deskew control signals indicating that deskew is used according to the position of the clock CLK0. PRE_D is a deskew control signal indicating that the phase of the data DATA0 is earlier than the phase of the clock CLK0. PRE_C is a deskew control signal indicating that the phase of the clock CLK0 is earlier than the phase of the data DATA0.

The data signal output unit 170 outputs a deskewed data signal in response to the deskew control signals S0, S1, S2, S3, PRE_D, and PRE_C. The clock output unit 180 outputs a deskewed clock in response to the deskew control signals S0, S1, S2, S3, PRE_D, and PRE_C.

The data signal output unit 170 may include a plurality of switching devices (not shown). Each of the switching devices outputs a corresponding one of the data signal DATA0 and the three delayed data signals DATA1, DATA2, and DATA3, in response to corresponding one of the deskew control signals S0, S1, S2, S3, PRE_D, and PRE_C.

The clock output unit 180 may include a plurality of switching devices (not shown). Each of the switching devices outputs a corresponding one of the clock CLK0 and the three delayed clocks CLK1, CLK2, and CLK3, in response to corresponding one of the deskew control signals S0, S1, S2, S3, PRE_D, and PRE_C.

Figure 10A:
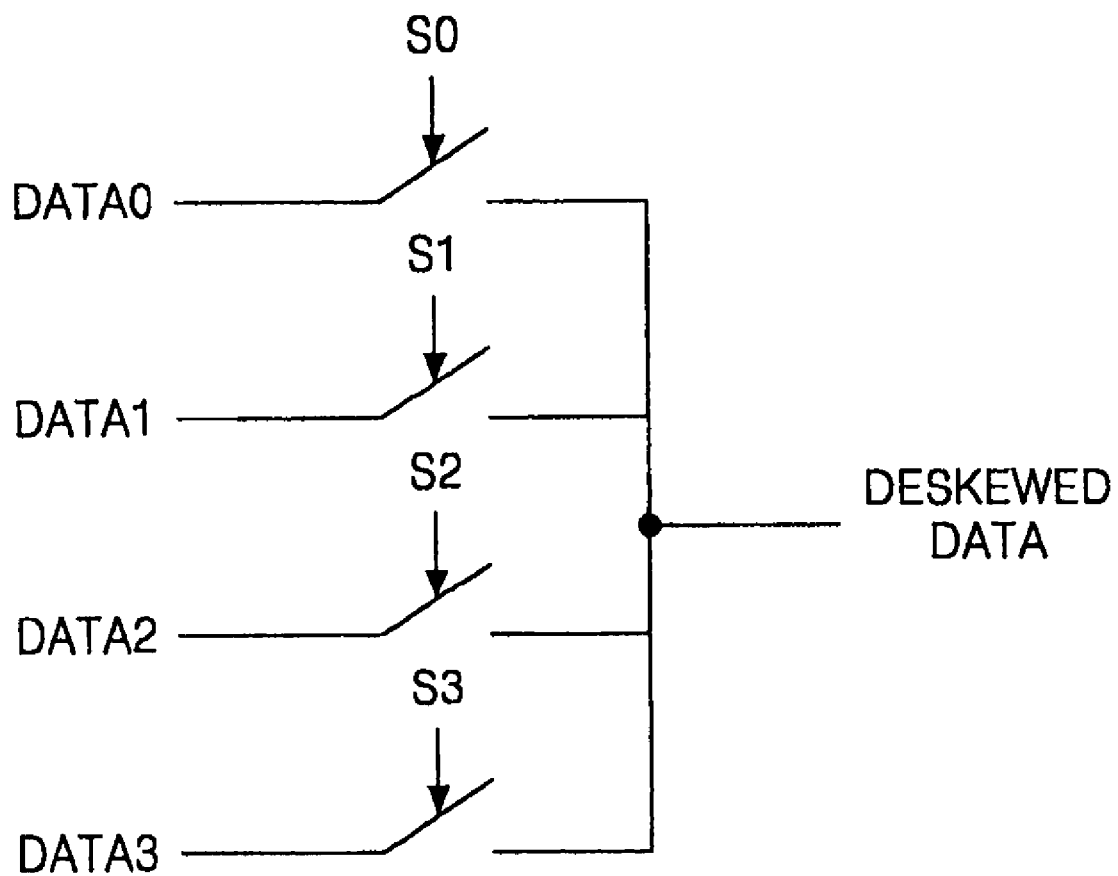
FIG. 10A is a circuit diagram showing a portion of the data output unit in a system in which the phase of a data signal is the same or earlier than that of clock.

FIG. 10A is a circuit diagram showing a portion of the data output unit 170 in a system in which the phase of the data signal DATA0 is the same or earlier than that of the clock CLK0. When the phase of the data signal DATA0 is earlier than that of the clock CLK0, the clock output unit 180 outputs the clock CLK0.

The data signal output unit 170 may output one having the smallest skew amount of the three delayed data signals DATA1, DATA2, and DATA3, in response to the deskew control signals S0, S1, S2, S3, PRE_D, and PRE_C. The data output unit 170 may further include a separate circuit (not shown) determining whether the data signal DATA0 is the same or earlier than that of the clock CLK0, in response to the deskew control signal PRE_D.

Figure 10B:
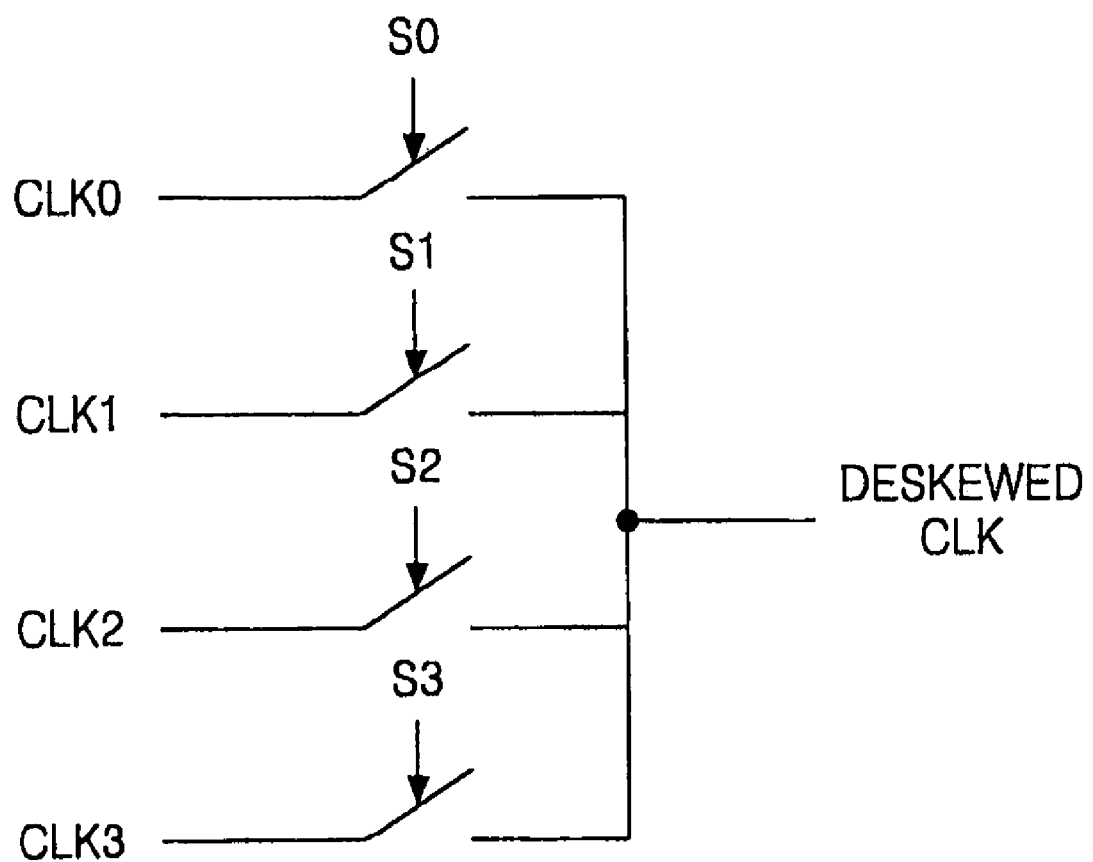
FIG. 10B is a circuit diagram showing a portion of the data output unit in a system in which the phase of clock is the same or earlier than that of the data signal.

FIG. 10B is a circuit diagram showing a portion of the data output unit 180 in a system in which the phase of the clock CLK0 is the same or earlier than that of the data signal DATA0. When the phase of the clock CLK0 is earlier that that of the data signal DATA0, the data output unit 170 outputs the data signal DATA0.

The clock output unit 180 may output one having the smallest skew amount of the three delayed clocks CLK1, CLK2, and CLK3, in response to the deskew control signals S0, S1, S2, S3, PRE_D, and PRE_C. The clock output unit 180 may further include a separate circuit (not shown) determining whether the clock CLK0 is the same or earlier than that of the data signal DATA0, in response to the deskew control signal PRE_C. When the phase of the data DATA0 is the same as that of the clock CLK0, the data output unit 170 and the clock output unit 180 shown in FIGS. 10A and 10B, respectively, output the data signal DATA0 and the clock CLK0.

Table 2 shows the deskewed data and the deskewed clock output from the data output unit 170 and the clock output unit 180 according to the deskew control signals S0, S1, S2, S3, PRE_D, and PRE_C.

TABLE 2

|  | S0 | S1 | S2 | S3 | Deskewed Data | Deskewed Clock |
|---|---|---|---|---|---|---|
| No skew | 1 | 0 | 0 | 0 | DATA0 | CLK0 |
| PRE_D | 0 | 1 | 0 | 0 | DATA1 | CLK0 |
|  | 0 | 0 | 1 | 0 | DATA2 | CLK0 |
|  | 0 | 0 | 0 | 1 | DATA3 | CLK0 |
| PRE_C | 0 | 1 | 0 | 0 | DATA0 | CLK1 |
|  | 0 | 0 | 1 | 0 | DATA0 | CLK2 |
|  | 0 | 0 | 0 | 1 | DATA0 | CLK3 |

Referring to Table 2, when there is no skew, the data output unit 170 and the clock output unit 180 respectively output the data signal DATA0 and the clock CLK0. When the phase of the data signal DATA0 is earlier than that of the clock CLK0 (PRE_D), the clock output unit 180 may output the clock CLK0 and the data output unit 170 may output the data signal DATA1 having a phase delayed by 30°, the data signal DATA2 having a phase delayed by 60°, or the data signal DATA3 having a phase delayed by 90° according to the skew amount.

However, when the phase of the clock CLK0 is earlier than that of the data signal DATA0 (PRE_C), the data output unit 170 may output the data signal DATA0 and the clock output unit 180 may output the clock CLK1 having a phase delayed by 30°, the clock CLK2 having a phase delayed by 60°, or the clock CLK3 having a phase delayed by 90° according to the skew amount.

Figure 11:
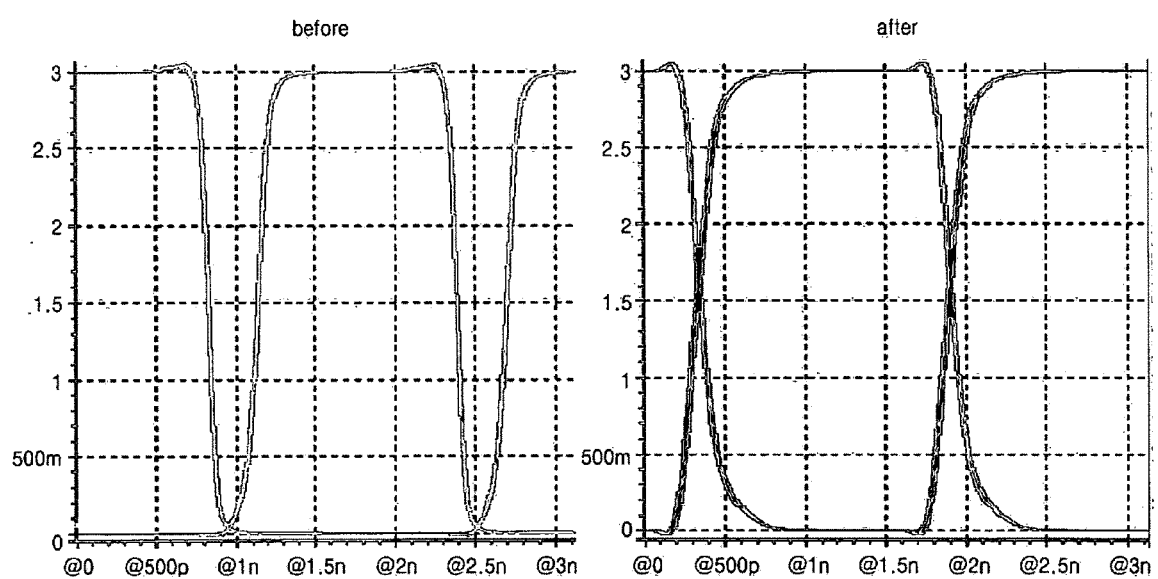
FIG. 11 is a graph showing the result of a simulation of the output signal of a phase compensation circuit of the deskew system according to an example embodiment of the present invention.

FIG. 11 is a graph showing the result of a simulation of the output signal of the first duty compensation circuit 113 of the deskew system 100 according to an example embodiment of the present invention. Referring to FIG. 11, a left eye pattern is an eye pattern before the correction of duty and it can be seen that a duty ratio distortion is generated. A right eye pattern is an eye pattern after the correction of duty and it can be seen that a cross point of an eye pattern a duty ratio distortion is generated.

Figure 12:
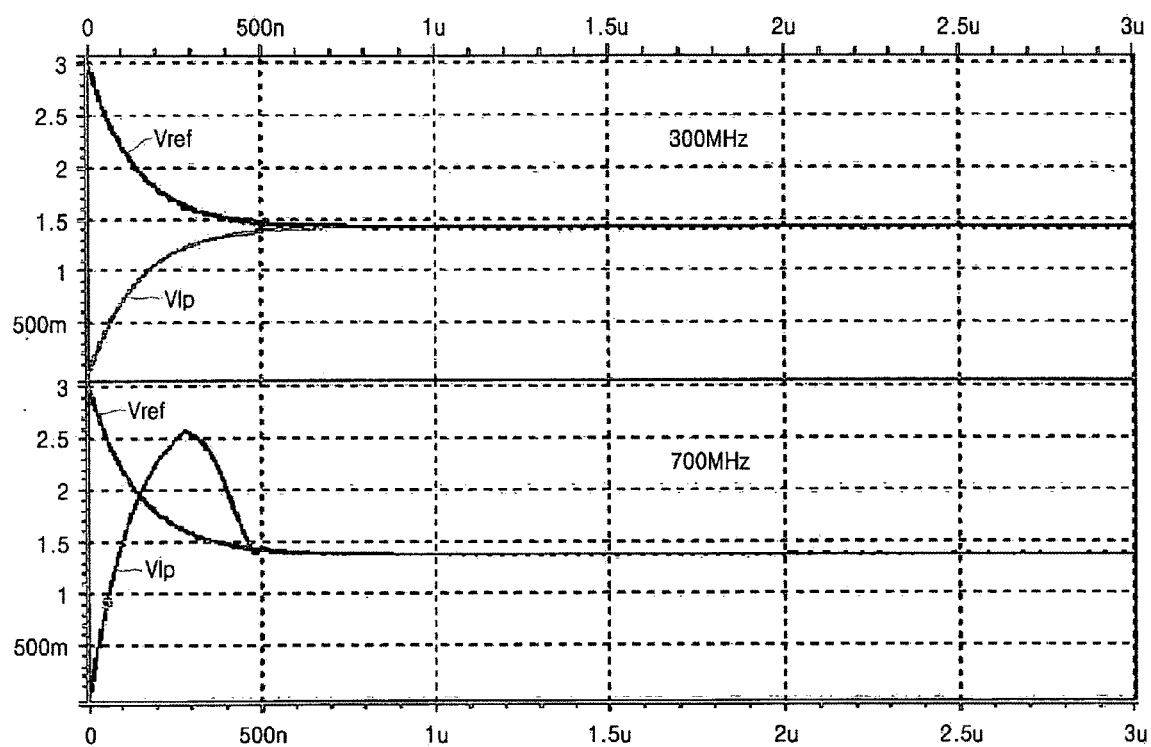
FIG. 12 is a graph showing the result of a simulation of a comparison voltage and a reference voltage of the phase control unit of a deskew system according to an example embodiment of the present invention.

FIG. 12 is a graph showing the result of a simulation of the comparison voltage Vlp and the reference voltage Vref of the phase control unit 130 of the deskew system 100 according to an example embodiment of the present invention. Referring to FIG. 12, when a clock frequency is 300 MHz and 700 MHz, the comparison voltage Vlp and the reference voltage Vref have the same voltage level within a 1 μsec. This means that the phase control signal Vcont generated based on the comparison voltage Vlp and the reference voltage Vref is maintained constant within 1 μsec so that the phase difference between the clock CLK0 and the clock CLK3 having a phase delayed by 90° is maintained constant at 90°.

Figure 13:
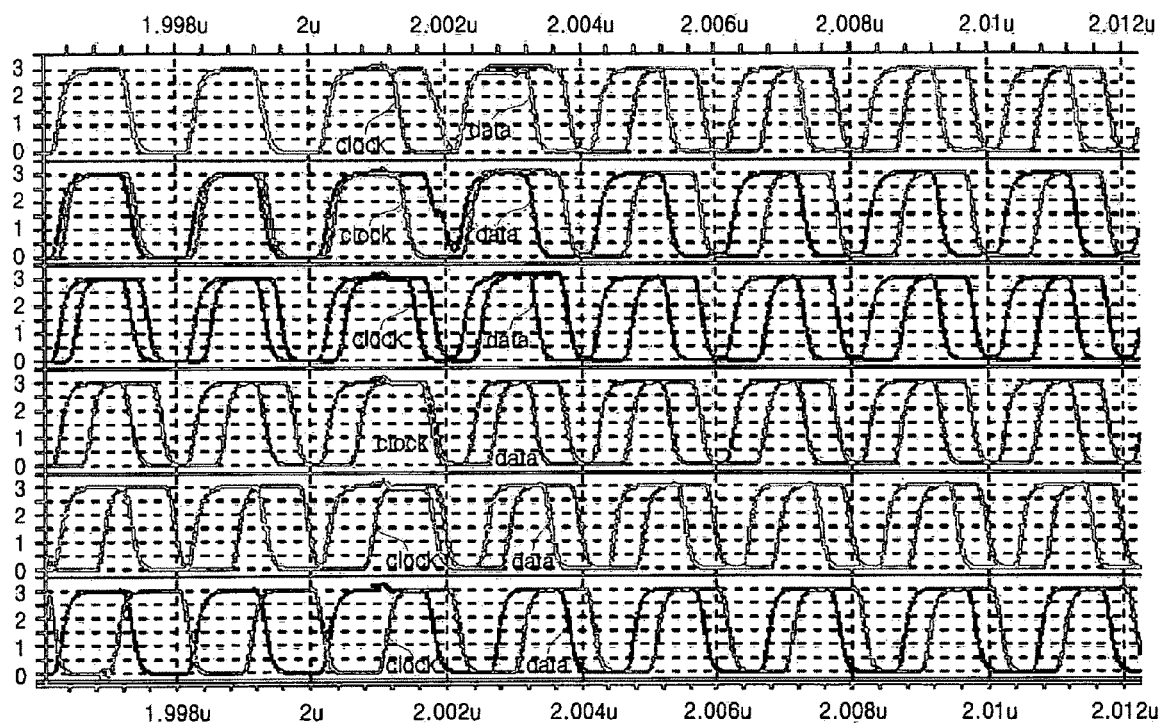
FIG. 13 is a graph showing the result of a simulation of the output signal of a deskew system according to an example embodiment of the present invention when a clock frequency is 500 MHz.

FIG. 13 is a graph showing the result of a simulation of the output signal of the deskew system 100 according to an example embodiment of the present invention when a clock frequency is 500 MHz. Referring to FIG. 12, the deskew system 100 completes a deskew operation after about 1.2 n sec after the deskew system 100 is enabled.

FIG. 14 is a graph showing the result of a simulation of the output signal of the deskew system 100 according to an example embodiment of the present invention when a clock frequency is 500 MHz and the amount of skew is variable. In FIG. 14, the left eye pattern is an eye pattern before the deskew operation according to the change in the skew amount while the right eye pattern is an eye pattern after the deskew operation. Referring to FIG. 14, even when there is a change in the skew amount, the deskew system 100 may precisely perform the deskew operation.

As described above, in the deskew system according to the present invention, the chip size is reduced so that a compact chip may be manufactured, low power drive is possible as the power consumption is reduced, and the resolution of skew compensation may be increased. Also, the duty compensation circuit may maintain the duty of a signal at 50%. A combination of the phase control unit and a voltage control delay may maintain the phase difference between two signals at a given phase difference.

While this invention has been particularly shown and described with reference to example embodiments thereof, it will be understood by those skilled in the art that various changes in form and details may be made therein without departing from the spirit and scope of the invention as defined by the appended claims.

What is claimed is:
1. A deskew system comprising:
a first voltage control delay configured to receive a data signal and generate N-numbered delayed data signals by delaying a phase of the data signal in units of 90/N, where N is a natural number that is not less than 1;

a second voltage control delay configured to receive a clock and generate N-numbered delayed clocks by delaying a phase of the clock in units of 90/N; and a skew compensation control unit configured to generate a plurality of deskew control signals to compensate for skew between the data signal and the clock based on the N-numbered delayed data signals and the N-numbered delayed clocks, wherein the skew compensation control unit includes, a sampling unit configured to sample the data signal at a first edge of each of the clock and the N-numbered delayed clocks, sample one of the N-numbered delayed data signals at a second edge of each of the clock and the N-numbered delayed clocks, and generate a sampling result output, and a deskew control unit configured to receive the sampling result output, determine an amount of the skew between the data signal and the clock based on the sampling result and generate a plurality of deskew control signals to compensate for the skew between the data signal and the clock based on the amount of the skew.

2. A deskew system comprising:

a first voltage control delay configured to receive a data signal and generate N-numbered delayed data signals by delaying a phase of the data signal in units of 90/N, where N is a natural number that is not less than 1, the first voltage control delay including, N-numbered first delay cells, each of the N-numbered first delay cells configured to delay the data signal or a data signal output from a neighboring delay cell and outputs one of the N-numbered delayed data signals, (N+1) numbered first buffers, each of the N+1 numbered first buffers configured to buffer the data signal or one of the N-numbered delayed data signals, and (N+1) numbered first duty compensation circuits, each of the N+1 numbered first duty compensation circuits configured to compensates for a duty of a data signal output from a corresponding buffer of the (N+1) numbered first buffers;

a second voltage control delay configured to receive a clock and generate N-numbered delayed clocks by delaying a phase of the clock in units of 90/N; and a skew compensation control unit configured to generate a plurality of deskew control signals to compensate for skew between the data signal and the clock based on the N-numbered delayed data signals and the N-numbered delayed clocks.

3. The deskew system of claim 2, wherein the second voltage control delay includes, N-numbered second delay cells, each of the N-numbered second delay cells configured to delay the clock or clock output from a neighboring delay cell and outputs one of the N-numbered delayed clocks, (N+1) numbered second buffers, each of N+1 numbered second buffers configured to buffer the clock or one of the N-numbered delayed clocks; and (N+1) numbered second duty compensation circuits, each of the N+1 numbered second duty compensation circuits configured to compensates for a duty of a clock output from a corresponding buffer of the (N+1) numbered second buffers.

4. The deskew system of claim 3, further comprising:

a phase control unit configured to receive the clock and one of the N-numbered delay clocks and generate a phase control signal to maintain at least one of (i) a phase difference between the clock and the one of the N-numbered delay clocks and (ii) a phase difference between the data signal and at a phase difference, wherein a delay time of each of the N-numbered first delay cells and the N-numbered second delay cells is adjusted in response to the phase control signal.

5. The deskew system of claim 4, wherein the phase control unit includes, a first logic operation unit including an exclusive OR operation for the clock and one of the N-numbered delay clocks, a first low pass filter configured to generate a comparison voltage based on a result of the exclusive logic OR operation, a second logic operation unit configured to receive the clock and generate a second clock based on the clock, a second low pass filter configured to generate a reference voltage having a constant voltage level based on the second clock, and a comparison unit configured to compare the comparison voltage and the reference voltage and generate the phase control signal.

6. The deskew system of claim 5, wherein the comparison unit includes, a pair of differential transistors including a first differential transistor and a second differential transistor, the first and second differential transistors configured to receive the comparison voltage and the reference voltage, respectively, a plurality of current mirror circuits coupled between a first output terminal and a second output terminal of the first differential transistor pair and configured to generate a phase control current based on current flowing in the first differential transistor and current flowing in the second differential transistor, and a third output terminal configured to output the phase control signal having a voltage level varying based on charge or discharge by the phase control current.

7. The deskew system of claim 3, wherein each of the N-numbered first delay cells and the N-numbered second delay cells includes, a pair of differential transistors configured to be driven in response to at least one of the data signal and the N-numbered delayed data signals or one of the clock and the N-numbered delayed clocks, and a load unit configured to control current through each of the pair of differential transistors, the local unit having an impedance value that varies based on the phase control signal, wherein a delay time of each of the N-numbered first delay cells and the N-numbered second delay cells is adjusted based on the amount of current flowing through the differential transistor pair.

8. The deskew system of claim 7, wherein each of the (N+1) numbered first duty compensation circuits and the (N+1) numbered second duty compensation circuits includes, a first logic operation unit configured to receive a power voltage and a first output signal of the differential transistor pair and perform a first logic operation on the received power voltage and the first output signal of the differential transistor pair, and a second logic operation unit configured to receive the power voltage, a second output signal of the differential transistor pair, and a result of the first logic operation, and performs a second logic operation on the received power voltage and the output signal of the differential transistor pair.

9. The deskew system of claim 8, wherein the first logic operation unit includes,
   a first sampling device configured to sample the power voltage in response to a first edge of the first output signal of the differential transistor pair, and
   an inverter configured to invert an output signal of the first sampling device and outputs the first logic operation result,
   wherein the first sampling device is reset in response to the first logic operation result.

10. The deskew system of claim 8, wherein the second logic operation unit includes,
   a second sampling device configured to sample the power voltage in response to a first edge of the second output signal of the differential transistor pair, and reset in response to the first logic operation result.

11. A deskew system comprising:
   a first voltage control delay configured to receive a data signal and generate N-numbered delayed data signals by delaying a phase of the data signal in units of 90/N, where N is a natural number that is not less than 1;
   a second voltage control delay configured to receive a clock and generate N-numbered delayed clocks by delaying a phase of the clock in units of 90/N;
   a skew compensation control unit configured to generate a plurality of deskew control signals to compensate for skew between the data signal and the clock based on the N-numbered delayed data signals and the N-numbered delayed clocks;
   a data signal output unit configured to output a deskewed data signal in response to the deskew control signals; and
   a clock output unit configured to output a deskewed clock in response to the deskew control signals.

12. The deskew system of claim 11, wherein the data signal output unit includes,
   a plurality of data switching devices, each of the plurality of data switching devices configured to output an output data signal corresponding to the data signal or one of the N-numbered delayed data signals in response to a corresponding deskew control signal, and the clock output unit including,
   a plurality of clock switching devices, each of the plurality of clock switching devices configured to outputs an output clock corresponding to the clock or one of the N-numbered delayed clocks in response to a corresponding deskew control signal.

13. The deskew system of claim 12, wherein
   when the phase of the data signal is earlier than the phase of the clock, the clock output unit outputs the clock in response to the deskew control signals and the data signal output unit outputs a delayed data signal having the smallest skew amount of the N-numbered delayed data signals in response to the deskew control signals.

14. The deskew system of claim 12, wherein,
   when the phase of the data signal is later than the phase of the clock, the data signal output unit outputs the data signal in response to the deskew control signal and the clock output unit outputs a delayed clock having the smallest skew amount of the N-numbered delayed clocks in response to the deskew control signals.

15. A phase control circuit comprising:
   a phase control unit configured to receive a first input signal and a second input signal and generate a phase control signal to maintain a phase difference between the first input signal and the second input signal based on the first input signal, the second input signal and a reference voltage, the phase control signal being based on a comparison between the first input signal and the second input signal; and
   a delay configured to generate the first input signal and the second input signal in response to the phase control signal, the delay including,
   at least one delay cell configured to delay a phase of a received signal based on the phase control signal.

16. The phase control circuit of claim 15, wherein the phase control unit includes,
   a first logic operation unit including an exclusive OR operation for the first input signal and the second input signal,
   a first low pass filter configured to obtain a comparison voltage based on a result of the exclusive OR operation,
   a second logic operation unit configured to generate a clock having a duty ratio corresponding to a phase difference between the first input signal and the second input signal,
   a second low pass filter configured to generate the reference voltage based on the clock, and
   a comparison unit configured to compare the comparison voltage and the reference voltage and generate the phase control signal based on the comparison.

17. The phase control circuit of claim 16, wherein the clock is a signal toggled in synchronization with a first edge of the first input signal.

18. The phase control circuit of claim 16, wherein the comparison unit includes,
   a pair of differential transistors including a first differential transistor and a second differential transistor, the first and second differential transistors configured to receive the comparison voltage and the reference voltage, respectively,
   a plurality of current mirror circuits coupled between a first output terminal and a second output terminal of the differential transistor pair and configured to generate a phase control current based on current flowing in the first differential transistor and current flowing in the second differential transistor; and
   a third output terminal configured to output the phase control signal having a voltage level varying based on charge or discharge by the phase control current.

* * * * *